(12) United States Patent
Kim

(10) Patent No.: US 9,923,578 B2
(45) Date of Patent: Mar. 20, 2018

(54) PARITY CHECK CIRCUIT AND MEMORY DEVICE INCLUDING THE SAME

(71) Applicant: SK hynix Inc., Gyeonggi-do (KR)

(72) Inventor: Chang-Hyun Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/403,881

(22) Filed: Jan. 11, 2017

(65) Prior Publication Data

US 2017/0123892 A1 May 4, 2017

Related U.S. Application Data

(62) Division of application No. 14/643,552, filed on Mar. 10, 2015, now Pat. No. 9,577,671.

(30) Foreign Application Priority Data

Dec. 5, 2014 (KR) .................. 10-2014-0174020

(51) Int. Cl.
  *G06F 11/10* (2006.01)
  *H03M 13/09* (2006.01)
  *G06F 3/06* (2006.01)

(52) U.S. Cl.
  CPC ............ *H03M 13/09* (2013.01); *G06F 3/064* (2013.01); *G06F 3/0619* (2013.01);
  (Continued)

(58) Field of Classification Search
  CPC .................... H03M 13/09; G06F 11/1004
  See application file for complete search history.

(56) References Cited

U.S. PATENT DOCUMENTS

| | | | |
|---|---|---|---|
| 3,755,779 A * | 8/1973 | Price | G06F 11/1028 714/772 |
| RE34,100 E * | 10/1992 | Hartness | G06F 11/1008 714/767 |

(Continued)

*Primary Examiner* — Joseph D Torres
(74) *Attorney, Agent, or Firm* — IP & T Group LLP

(57) ABSTRACT

A parity check circuit may include a first signal combination unit for generating first to $N^{th}$ combination signals by combining first to $N^{th}$ signals, wherein a $K^{th}$ (K is a natural number of $2 \leq K \leq N$) combination signal of the first to $N^{th}$ combination signals is obtained by combining the first to $K^{th}$ signals of the first to $N^{th}$ signals, a parity check unit for detecting whether an error is present in the first to $N^{th}$ signals in response to the $N^{th}$ combination signal, a second signal combination unit for generating first to $N^{th}$ reconstruction signals by combining the first to $N^{th}$ combination signals, wherein a $K^{th}$ reconstruction signal of the first to $N^{th}$ reconstruction signals is obtained by combining a $(K-1)^{th}$ combination signal and the $K^{th}$ combination signal of the first to $N^{th}$ combination signals, and a signal storage unit for storing the first to $N^{th}$ reconstruction signals.

7 Claims, 6 Drawing Sheets

(52) U.S. Cl.
CPC ............ *G06F 3/0679* (2013.01); *G06F 11/10* (2013.01); *G06F 11/1004* (2013.01)

(56) References Cited

U.S. PATENT DOCUMENTS

| | | | | |
|---|---|---|---|---|
| 5,193,092 | A | * | 3/1993 | Hartoog ............. G01R 31/3185 714/732 |
| 5,577,199 | A | * | 11/1996 | Tanabe .................. G06F 11/185 714/37 |
| 5,692,021 | A | * | 11/1997 | Walker .................. H04J 3/0605 375/354 |
| 6,597,595 | B1 | * | 7/2003 | Ichiriu .................... G11C 15/00 365/189.07 |
| 2007/0226600 | A1 | * | 9/2007 | Ogawa ................ G06F 11/1008 714/798 |

* cited by examiner

PARITY CHECK CIRCUIT AND MEMORY DEVICE INCLUDING THE SAME

CROSS-REFERENCE TO RELATED APPLICATION(S)

This application is a division of U.S. patent application Ser. No. 14/643,552 filed on Mar. 10, 2015 which claims priority of Korean Patent Application No. 10-2014-0174020, filed on Dec. 5, 2014. The disclosure of each of the foregoing application is incorporated herein by reference in its entirety.

BACKGROUND

1. Field

Exemplary embodiments of the present invention relate to a parity check circuit and a memory device including the same.

2. Description of the Related Art

A parity check is a technology for checking whether data has been lost or damaged during transmission. There are multiple different types of parity check methods being used in the verification of data transmission. In addition, n-out-of-r code (nCr) methods and cyclic redundancy check (CRC) methods are also used to verify the transmission of data.

In a parity check, the number of bits of received multi-bit data that have a value of "1" is set as an even (or odd) number. Therefore, an error in the received data may be detected by checking whether the received data have an even (or odd) number of bits with a value of 1 For example, in an even parity check, if the number of bits of received multi-bit data that have a value of "1" is an even number, it means no errors should be present, the number of bits having a value of "1" is odd, this means there is an error. In contrast, in an odd parity check, if the number of bits of received multi-bit data that have a value of "1" is an odd number, there should not be any errors. If there is an even number of bits with a value of "1", an error has occurred.

In accordance with the JEDEC specs for DDR4 SDRAM, now being discussed in the industry, a function for performing a parity check using a command and an address applied to a memory device and sending information about the command to a memory controller if an error is detected in the command is defined. The memory controller may stop operations subsequent to the command, that is, operations after an error occurs, based on transmitted detection information.

For a parity check, parity data combined through exclusive OR (hereinafter referred to as XOR) for all the bits of data to be checked may be generated. If there are a lot data bits to be checked parity data needs to be generated by connecting multi-stage XOR gates. An XOR gate has asynchronous delay and is problematic in that it may generate data errors or cause difficulty in setting the timing of a parity check operation accurately.

SUMMARY

Various embodiments are directed to a technology capable of removing a glitch attributable to asynchronous delay and accurately setting parity operation timing using a dock in a process of performing XOR combinations on the bits of data to be checked in order to produce parity data.

Also, various embodiments are directed to a technology capable of preventing an increase in the number of circuits attributable to a change of a parity check circuit by generating reconstructed data the same as the original data and storing the reconstructed data when an error occurs.

In an embodiment, a parity check circuit may include a first signal combination unit suitable for generating first to $N^{th}$ (N is a natural number) combination signals by combining one or more of first to $N^{th}$ signals, wherein the first combination signal is, the first signal and a $K^{th}$ (K is a natural number of $2 \le K \le N$) combination signal of the first to $N^{th}$ combination signals is obtained by combining the first to $K^{th}$ signals of the first to $N^{th}$ signals, a parity check unit suitable for detecting whether an error is present in the first to $N^{th}$ signals in response to the $N^{th}$ combination signal, a second signal combination unit suitable for generating first to $N^{th}$ reconstruction signals by combining one or more of the first to $N^{th}$ combination signals, wherein the first reconstruction signal is the first combination signal and a $K^{th}$ reconstruction signal of the first to $N^{th}$ reconstruction signals is obtained by combining a $(K-1)^{th}$ combination signal and the $K^{th}$ combination signal of the first to $N^{th}$ combination signals, and a signal storage unit suitable for storing the first to $N^{th}$ reconstruction signals based on a detection result of the parity check unit.

In an embodiment, a parity check circuit may include a plurality of first flip-flops suitable for storing and outputting corresponding signals of first to $N^{th}$(N is a natural number) signals in response to a clock, a first combination unit suitable for performing XOR combinations on two or more output signals of the first flip-flops, a second combination unit suitable for generating first to $N^{th}$ combination signals by performing XOR combinations on two or more of the output signals of the first flip-flops and an output signal of the first combination unit in response to the clock, wherein the first combination signal is the first signal and a $K^{th}$ (K is a natural number of $2 \le K \le N$) combination signal of the first to N combination signals is obtained by combining the first to $K^{th}$ signals of the first to $N^{th}$ signals, a parity check unit suitable for detecting whether an error is present in the first to $N^{th}$ signals in response to the $N^{th}$ combination signal, a third combination unit suitable for generating first to $K^{th}$ reconstruction signals by combining one or more of the first to $N^{th}$ combination signals, wherein the first reconstruction signal is the first combination signal and $K^{th}$ reconstruction signal of the first to $N^{th}$ reconstruction signals is obtained by combining a $(K-1)^{th}$ combination signal and the $K^{th}$ combination signal of the first to $N^{th}$ combination signals, and a signal storage unit suitable for storing the first to $N^{th}$ reconstruction signals based on a detection result of the parity check unit.

In an embodiment, a memory device may include a command input unit suitable for receiving a plurality of command signals, an address input unit suitable for receiving a plurality of address signals, a parity check circuit suitable for combining the plurality of command signals and the plurality of address signals in synchronization with a clock, detecting whether an error is present based on a result of combination, and storing the plurality of command signals and the plurality of address signals based on a result of detection, a command decoder suitable for generating internal commands by decoding the plurality of command signals based on the result of the detection of the parity check circuit, and a result output unit suitable for externally outputting the result of the detection of the parity check circuit.

DETAILED DESCRIPTION

Figure 1:
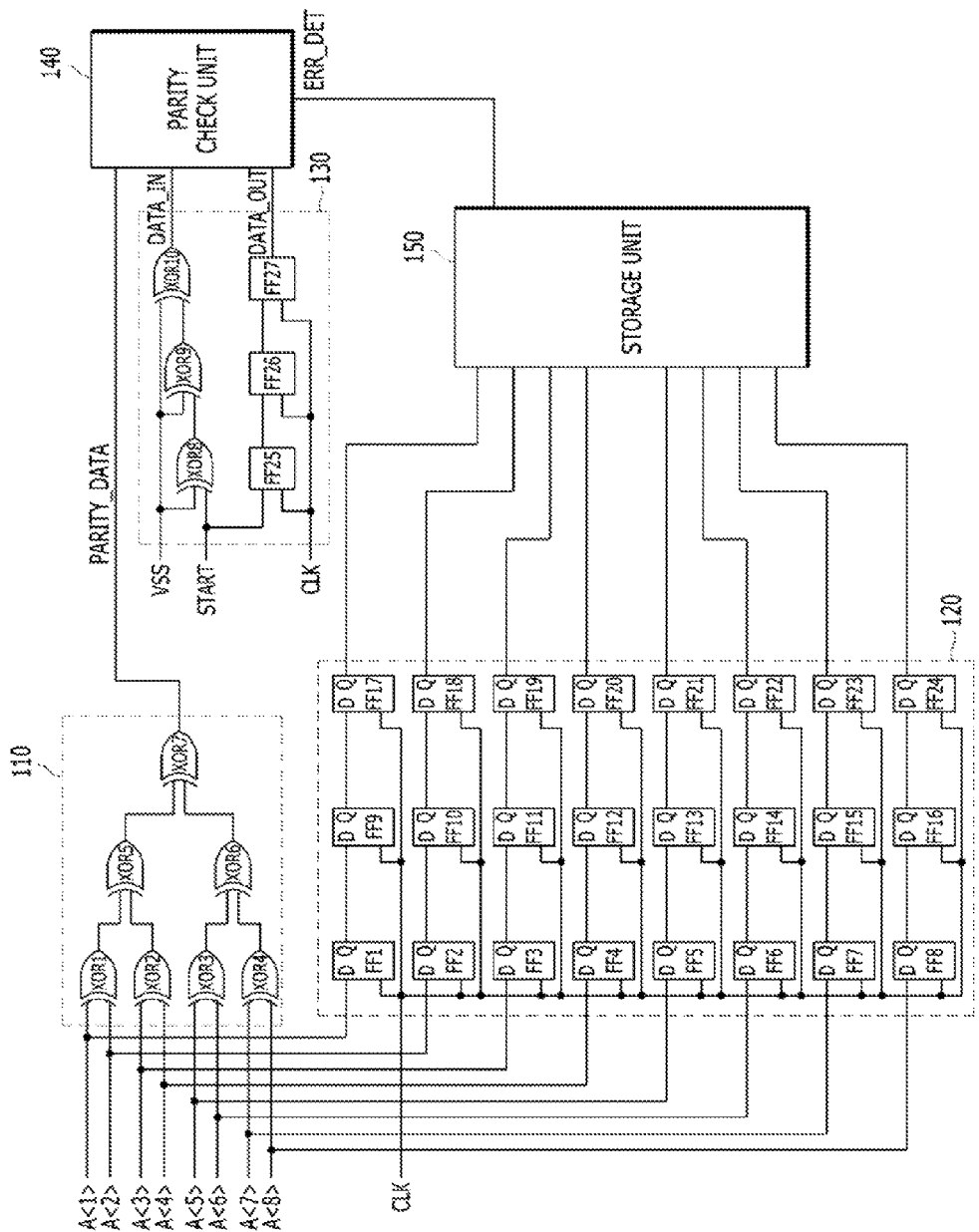
FIG. 1 is an example of a parity check circuit.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

When an element is referred to as being connected or coupled to another element, it should be understood that the former can be directly connected or coupled to the latter, or electrically connected or coupled to the latter via an intervening element therebetween. Furthermore, when it is described that one "compromises" (or "includes") or "has" some elements, it should be understood that it may comprise (or include) or have only those elements, or it may comprise (or include) or have other elements as well as those elements, if there is no specific limitation. The terms of singular form may include plural forms unless referred to the contrary.

FIG. 1 is an example of the configuration of a parity check circuit.

Referring to FIG. 1, the parity check circuit may include a signal combination unit 110, a shifting unit 120, a control unit 130, a parity check unit 140, and a storage unit 150. It is described below as an example that the parity check circuit performs a parity check on 8-bit data A<1:8>.

The signal combination unit 110 may generate parity data PARITY_DATA that is used for a parity check by performing XOR combinations on the bits A<1:8> of target data to be parity-checked. To this end, the signal combination unit 110 may include a plurality of XOR gates XOR1-XOR7.

When a parity check operation is started, the shifting unit 120 may shift the bits A<1:8> of the data to be checked in response to a clock CLK and output the shifted data A<1:8> to the storage unit 140. For this operation, the shifting unit 120 may include a plurality of flip-flops FF1-FF24.

The control unit 130 may control the timing of operations and outputting an error detection result of the parity check unit 140. If a signal START is activated and the data A<1:8> is inputted to the parity check circuit, the control unit 130 may activate a signal DATA_IN by taking into consideration the time when the data A<1:8> is combined so that the check operation of the parity check unit 140 begins. Furthermore, the control unit 130 may activate a signal DATA_OUT by taking into consideration the time when the data A<1:8> shifts and arrives at the storage unit 150 so that the parity check unit 140 outputs an error detection result ERR_DET. To this end, the control unit 130 may include XOR gates XOR8-XOR10 and flip-flops FF25-FF27. For reference, the flip-flops FF1-FF27 may be D-flip-flops.

When the signal DATA_IN is activated, the parity check unit 140 may receive the parity data PARITY_DATA and perform a parity check. When the signal DATA_OUT is activated, the parity check unit 140 may output the error detection result ERR_DET. The parity check unit 140 may activate the error detection result ERR_DET if an error is present and may deactivate the error detection result ERR_DET if an error is not present.

The storage unit 150 may store the data A<1:8> outputted by the flip-flops FF17-FF24 if an error is present as a result of the detection of the parity check unit 140 and may not store the data A<1:8> outputted by the flip-flops FF17-FF24 if an error is not present as a result of the detection of the parity check unit 140.

In this case, the signal combination unit 110 includes the multi-stage XOR gates, that is a circuit for generating asynchronous delay. Accordingly, if a glitch occurs, an error not included in the data A<1:8> occurs or it is difficult to set parity check timing. FIG. 1 illustrates an example where a parity check is performed on 8-bit data and XOR gates having three stages. In actual DRAM4, however, in order to perform a parity check on commands/addresses, XOR combinations need to be performed on a signal of 20 bits or more. Accordingly, XOR gates of 5 stages or more are required. This increases the possibility that an error will occur and makes it more difficult to set parity operation timing.

Figure 2:
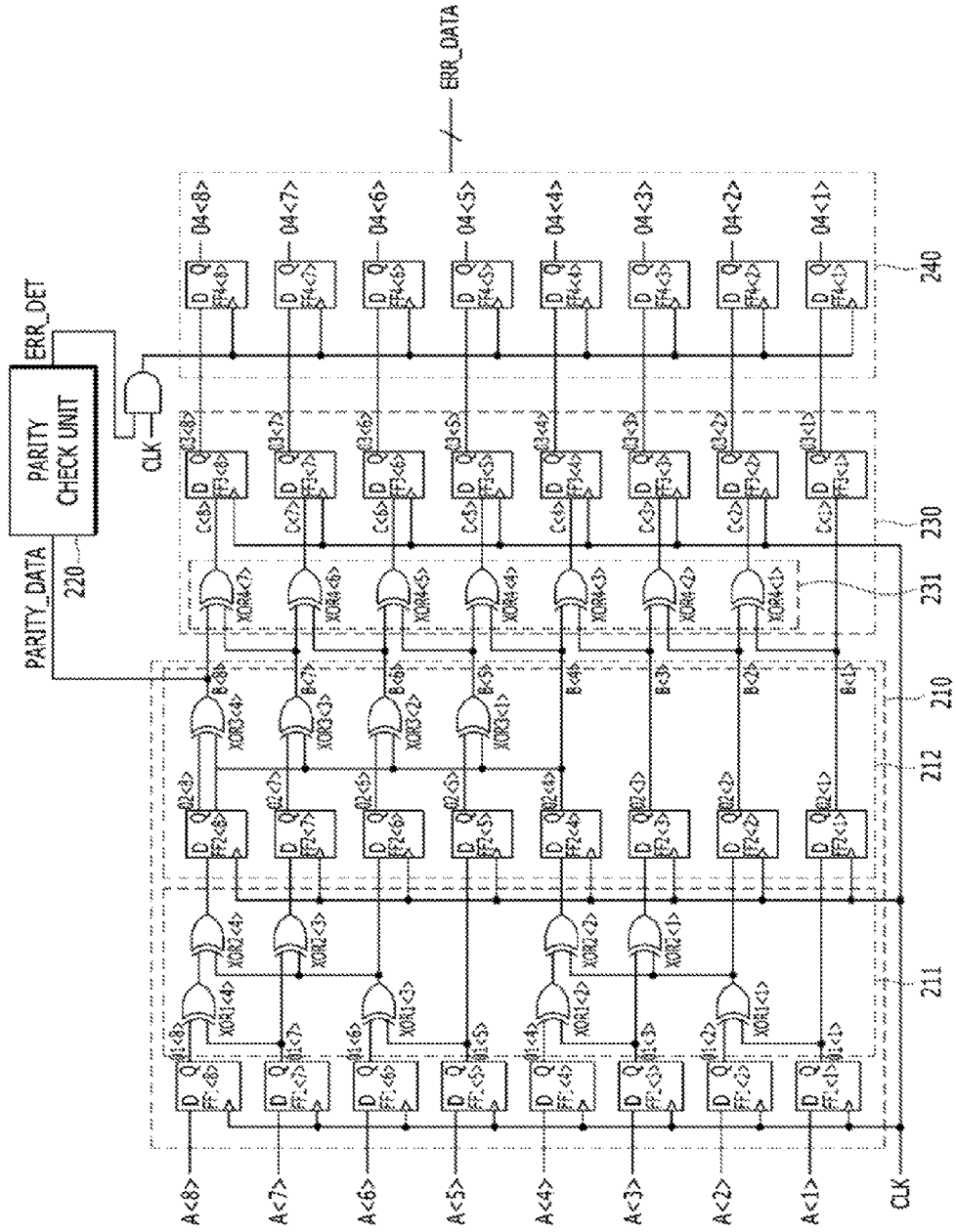
FIG. 2 illustrates a parity check circuit in accordance with an embodiment of the present invention.

FIG. 2 illustrates the configuration of a parity check circuit in accordance with an embodiment of the present invention.

Referring to FIG. 2, the parity check circuit may include a first signal combination unit 210, a parity check unit 220, a second signal combination unit 230, and a signal storage unit 240. It is described as an example that the parity check circuit performs a parity check on 8-bit data A<1:8>.

The first signal combination unit 210 may generate first to $N^{th}$ (N is a natural number, for example, 8) combination signals B<1:8> by combining one or more of first to $N^{th}$ signals A<1:8>. In this case, the $K^{th}$ (K is a natural number of 2≤K≤N) combination signal of the first to $N^{th}$ combination signals B<1:8> may be obtained by combining the first to $K^{th}$ signals A<1>-A<K> of the first to $N^{th}$ signals A<1:8>. Furthermore, the first combination signal B<1> may be the first signal A<1>. In this case, the first signal combination unit 210 may operate in synchronization with a clock CLK.

The first signal combination unit 210 may include a plurality of first flip-flops FF1<1:8>. The first flip-flops FF1<1:8> may receive corresponding signals of the first to $N^{th}$ signals A<1:8> in synchronization with the dock CLK, may store the received signals, and may output the stored signals to their output stages Q as first output signals O1<1:8>.

The first signal combination unit 210 may include a first combination unit 211 for performing XOR combinations on two or more of the first output signals O1<1:8>, The first combination unit 211 may include a plurality of first gates XOR1<1:4> for performing XOR combinations on two or more of the first output signals O1<1:8> and a plurality of second gates XOR2<1:4> for performing XOR combinations on two or more of the first output signals O1<1:8> and the output signals of the first gates XOR1<1:4>. In this case, the first gates XOR1<1:4> may combine only the output signals O1<1:8>, and the second gates XOR2<1:4> may combine at least one of the output signals of the first gates XOR1<1:4>.

The first signal combination unit 210 may include a second combination unit 212 for generating first to $N^{th}$ combination signals B<1:8> by performing XOR combinations on two or more of the first output signals O1<1:8> and signals generated by the first combination unit 211 in synchronization with the clock CLK. The second combination unit 212 may include one or more combination stages including two or more gates XOR3<1:4> for performing an XOR combination on two or more received signals and outputting the combined signal and one or more flip-flop stages including two or more flip-flops FF2<1:8> for storing and outputting a received signal in response to the clock CLK. The one combination stage may indicate a unit including gates disposed in parallel, such as the plurality of first gates XOR1<1:4> or the plurality of second gates XOR2<1:4>. Furthermore, the one flip-flop stage may indicate a unit including flip-flops disposed in parallel, such as the plurality of first flip-flops FF1<1:8>.

The second combination unit 212 may include the plurality of second flip-flops FF2<1:8>. The second flip-flops FF2<1:8> may receive corresponding signals of the first output signals O1<1:8> and the output signals of the first combination unit 211 in synchronization with the clock CLK, may store the received signals, and may output the stored signals to their output stages Q as second output signals O2<1:8>. Furthermore, the second combination unit 212 may include the plurality of third gates XOR3<1:4> for performing XOR combinations on two or more of the second output signals O2<1:8>.

The combination (gate) stages and the flip-flop stages may be alternately disposed in the second combination unit 212. In FIG. 2, the plurality of second flip-flops FF2<1:8> and the plurality of third gates XOR3<1:4> are sequentially disposed.

As illustrated in FIG. 2, in the first signal combination unit 210, one or more of the combination stages XOR1<1:4>-XOR3<1:4> and one or more of the flip-flop stages FF1<1:4> and FF2<1:4> may be alternately disposed. A flip-flop stage may be disposed between combination stages that operate without being synchronized with the dock CLK and thus a combination of signals may be performed in synchronization with the clock CLK.

The parity check unit 220 may detect whether an error is present in the first to $N^{th}$ signals A<1:8> in response to the $N^{th}$ combination signal 8<8>. The parity check unit 220 may determine whether an even or odd number of signals having a level of "1" belong to the first to $N^{th}$ signals A<1:8> through the $N^{th}$ combination signal B<8> and may detect whether an error is present based on a result of the determination. The parity check unit 220 may activate a latch enable signal ERR_DET if an error has occurred and may deactivate the latch enable signal ERR_DET if an error has not occurred.

The second signal combination unit 230 may generate first to $N^{th}$ reconstruction signals C<1:8> by combining one or more of the first to $N^{th}$ combination signals B<1:8>. In this case, the $K^{th}$ reconstruction signal C<1> of the first to $N^{th}$ reconstruction signals C<1:8> may be a signal obtained by combining the $(K-1)^{th}$ combination signal B<K-1> and the $K^{th}$ combination signal B<K> of the first to $N^{th}$ combination signals 8<1:8>. Furthermore, the first reconstruction signal C<1> may be the first combination signal B<1>. In this case, the second signal combination unit 230 may operate in synchronization with the clock CLK.

The second signal combination unit 230 may include a third combination unit 231 and a plurality of third flip-flops FF3<1:8>. The third combination unit 231 may include a plurality of fourth gates XOR4<1:7>. The fourth gates XOR4<1:7> may generate the reconstruction signals C<1:8> by performing an XOR combination on two of the combination signals B<1:8>. In this case, the first to $N^{th}$ reconstruction signals C<1:8> may correspond to the respective first to $N^{th}$ signals A<1:8>, and the first to $N^{th}$ reconstruction signals C<1:8> may have the same logic values as the respective first to $N^{th}$ signals A<1:8>. The plurality of third flip-flops FF3<1:8> may receive corresponding signals of the reconstruction signals C<1:8> in synchronization with the clock CLK, may store the received signals and may output the stored signals to their output stages Q as third output signals O3<1:8>.

The signal storage unit 240 may store the reconstruction signals C<1:8>, i.e., the third output signals O3<1:8>, if an error has occurred based on the detection result of the parity check unit 220, i.e., the latch enable signal ERR_DET, and may not store the reconstruction signals C<1:8> if an error has not occurred based on the detection result of the parity check unit 220. To store the reconstruction signals C<1:8> may mean that the first to $N^{th}$ signals A<1:8> are stored because the reconstruction signals C<1:8> have the same logic values as the respective first to $N^{th}$ signals A<1:8> as described above.

The signal storage unit 240 may include a plurality of fourth flip-flops FF4<1:8>. If the latch enable signal ERR_DET is activated, the first flip-flops FF1<1:8> may receive corresponding signals of the third output signals O3<1:8> in synchronization with the clock CLK, may store the received signals, and may output the stored signals to their output stages Q as fourth output signals O4<1:8>.

If an error has occurred based on the detection result of the parity check unit 220 and thus the first to $N^{th}$ reconstruction signals C<1:8> have been stored, the signal storage unit 240 may output a stored value to the outside (ERR_DATA).

The parity check circuit of FIG. 2 may minimize problems occurring due to a combination stage, that is, an asynchronous delay circuit, and perform a parity check operation at accurate timing in synchronization with the clock CLK because a flip-flop stage is disposed between combination stages for combining signals, as described above. Furthermore, since the reconstructed data C<1:8> having the same logic values as the original data A<1:8> are generated and stored, an increase in the number of circuits that are required in the flip-flop stage may be minimized.

In the example of FIG. 2, the parity check circuit includes the three gate stages XOR1<1:4>-XOR3<1:4> for performing a parity check on eight bits and the single flip-flop stage FF2<1:8> for preventing asynchronous delay. In general, the probability of problems attributable to asynchronous delay may occur is increased as the number of bits of data on which a parity check needs to be performed is increased, because the number of gate stages required to combine the data is increased accordingly. The parity check circuit of FIG. 2 may be more effective as the number of bits of data is increased.

For reference, in DDR4 DRAM, a parity check is commonly performed on 24 signals, such as a plurality of command signals ACTB, CASB, RASB, and WEB and a plurality of address signals A<0:13>, BK<0:1>, BG<0:1>, and C<0:1>. To this end, five or more gate stages are configured. In this case, one or more flip-flop stages may be disposed between the gate stages so that a parity check operation is performed at accurate timing.

Figure 3:
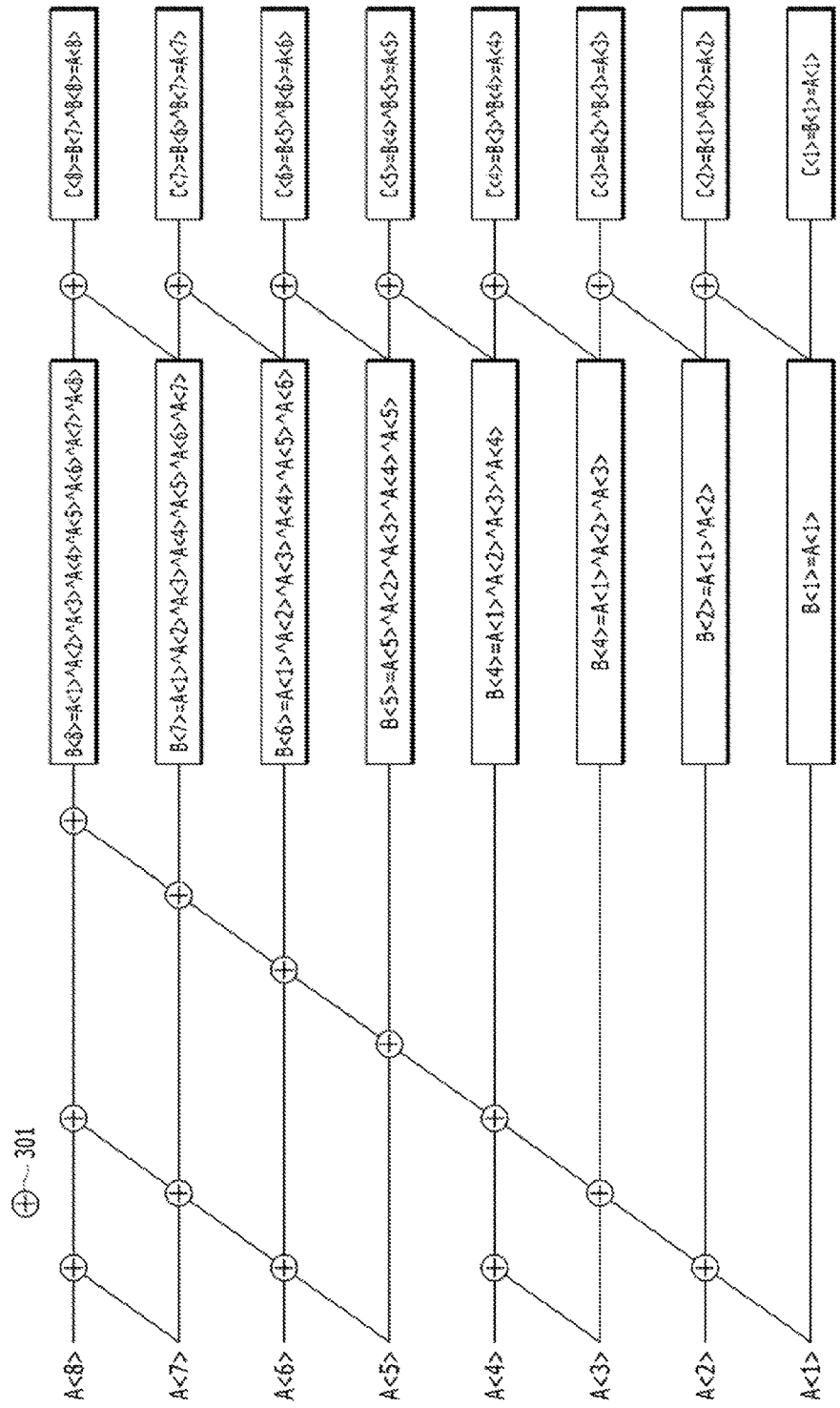
FIG. 3 is a diagram conceptually illustrating a process of generating B<1:8> and C<1:8> through XOR combinations in FIG. 2.

FIG. 3 is a diagram conceptually illustrating a process of generating the signals B<1:8> and C<1:8> through XOR combinations in FIG. 2.

A symbol 301 denotes an XOR combination of two signals. FIG. 3 illustrates that the combined signals B<1:8>, C<1:8> correspond to XOR combinations of signals. The expression Z=X^Y indicates that a signal Z is a signal of an XOR combination of a signal X and a signal Y.

The data A<1:8> experiences a multi-stage XOR combination process in the first signal combination unit 210, thereby producing the combined signals B<1:8>. As illustrated in FIG. 2, B<1>=A<1>, B<K>=A<1>^ . . . ^A<K> (K being a natural number of 2≤K≤8).

The signals B<1:8> go through an XOR combination process in the second signal combination unit 230, thereby producing the combined signals C<1:B>. As illustrated in FIG. 2, C<1>=A<1>, C<K>=B<K>^B<K−1>=A<K>.

Figure 4:
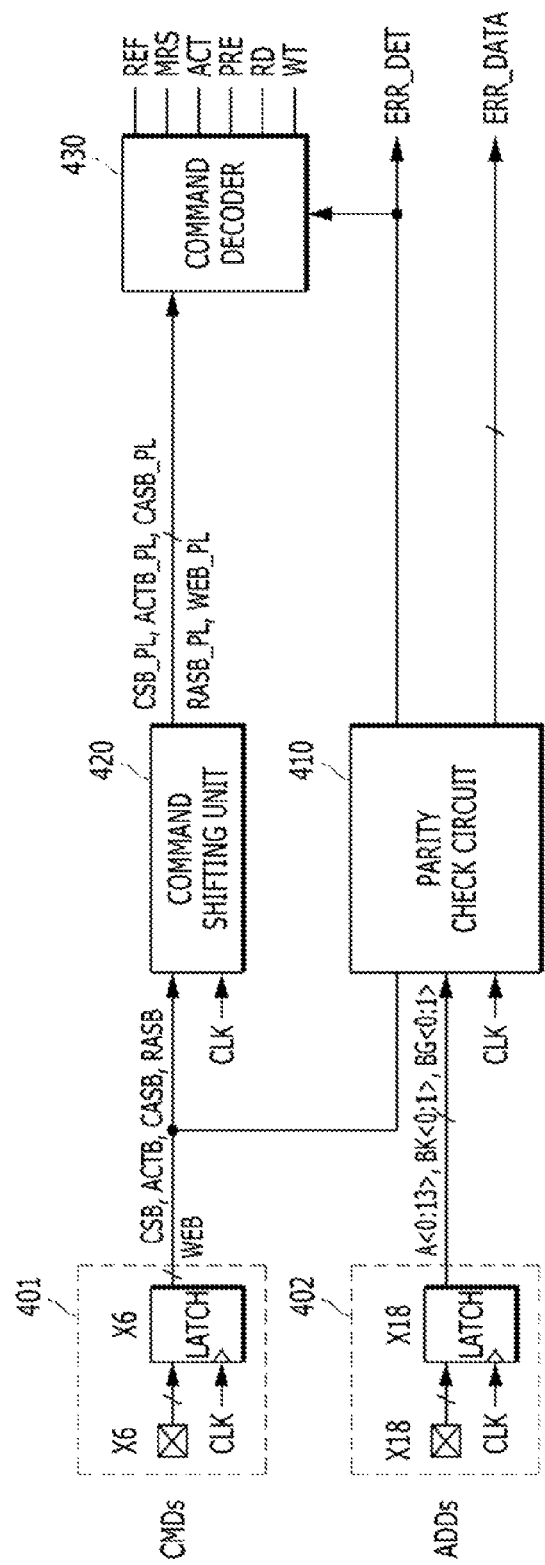
FIG. 4 illustrates a memory device in accordance with an embodiment of the present invention.

FIG. 4 illustrates the configuration of a memory device in accordance with an embodiment of the present invention.

Referring to FIG. 4, the memory device may include a command input unit 401, an address input unit 402, a parity check circuit 410, a command shifting unit 420, and a command decoder 430.

The command input unit 401 may latch command signals CMDs received from outside of the memory device and provide the command signals to circuits within the memory device. The address input unit 402 may latch received address signals ADDs and provide the address signals to circuits within the memory device. The command input unit 401 and the address input unit 402 may include latches corresponding to the number of received signals (e.g., 24 in FIG. 4).

The command shifting unit 420 may shift command signals CBS, ACT, RASB, and WEB by a time for a parity check in synchronization with a clock CLK. In general, this time called parity latency (PL). The PL may be set by the mode register set (MRS) of the memory device.

The command decoder 430 may generate internal commands REF, MRS, ACT, PRE, RD, and WT by decoding command signals CBS_PL, ACTB_PL, CASB_ PL, RASB_PL, and WEB_PL obtained by the shifting of the command shifting unit 420. The internal commands may include the refresh command REF, the m ode register set command MRS, the active command ACT, the precharge command PRE, the read command RD, and the write command WT. The memory device performs operations corresponding to the internal commands REF, MRS, ACT, PRE, RD, and WT generated by the command decoder 430. The command decoder 430 may receive a parity check result ERR_DET and stop the generation of the internal commands REF, MRS, ACT, PRE, RD, and WT if an error is detected.

The parity check circuit 410 may perform a parity check on the plurality of command signals CBS, ACTB, CASB, RASB, and WEB and a plurality of address signals A<0:13>, BK<0:1>, and BG<0:1> and detect whether an error is present. The parity check circuit 410 may be configured similar to the parity check circuit of FIG. 2, but receive 24, bits rather than 8 bits, and perform a parity check. The parity check circuit 410 may output the parity check result ERR_DET.

The memory device may further include a result output unit (not shown). The result output unit may output the parity check result ERR_DET and error data ERR_DATA to the outside of the memory device. In this case, the parity check result ERR_DET and the error data ERR_DATA may be outputted through a data pad that is used to input and output the data of the memory device or a separate pad for outputting error information.

The memory device may perform operations corresponding to external command signals and may stop an operation corresponding to a command signal in which an error has occurred if the error is detected as a result of a parity check. Furthermore, the memory device may not perform an operation although command signals are received after an error is generated until it is reset.

The aforementioned command signals are described below. The command signal CSB denotes a chip select signal, and the command signal ACTB denotes an active signal, and the command signal RASB denotes a row address strobe signal, and the command signal CASB denotes a column address strobe signal, and the command signal WEB denotes a write enable signal. A suffix "B" attached to each of the command signals indicates that a corresponding signal is an active state when the corresponding signal has a level of "0". Furthermore, the address signals are described below. The address signals A<0:13> denote Nos. 0~13 addresses, and the address signals BK<0:1> denote Nos. 0~1 bank addresses, and the address signals BG<0:1> denote Nos. 0~1 bank group addresses.

In particular in an embodiment of the present invention, the command signals and the address signals defined in the specification of DDR4 SDRAM have been described as an example, but the type of command signals and the number of address signals may be changed. Furthermore, an embodiment of the present invention may also be applied to all types of memory devices for detecting whether an error is present in a command.

Figure 5:
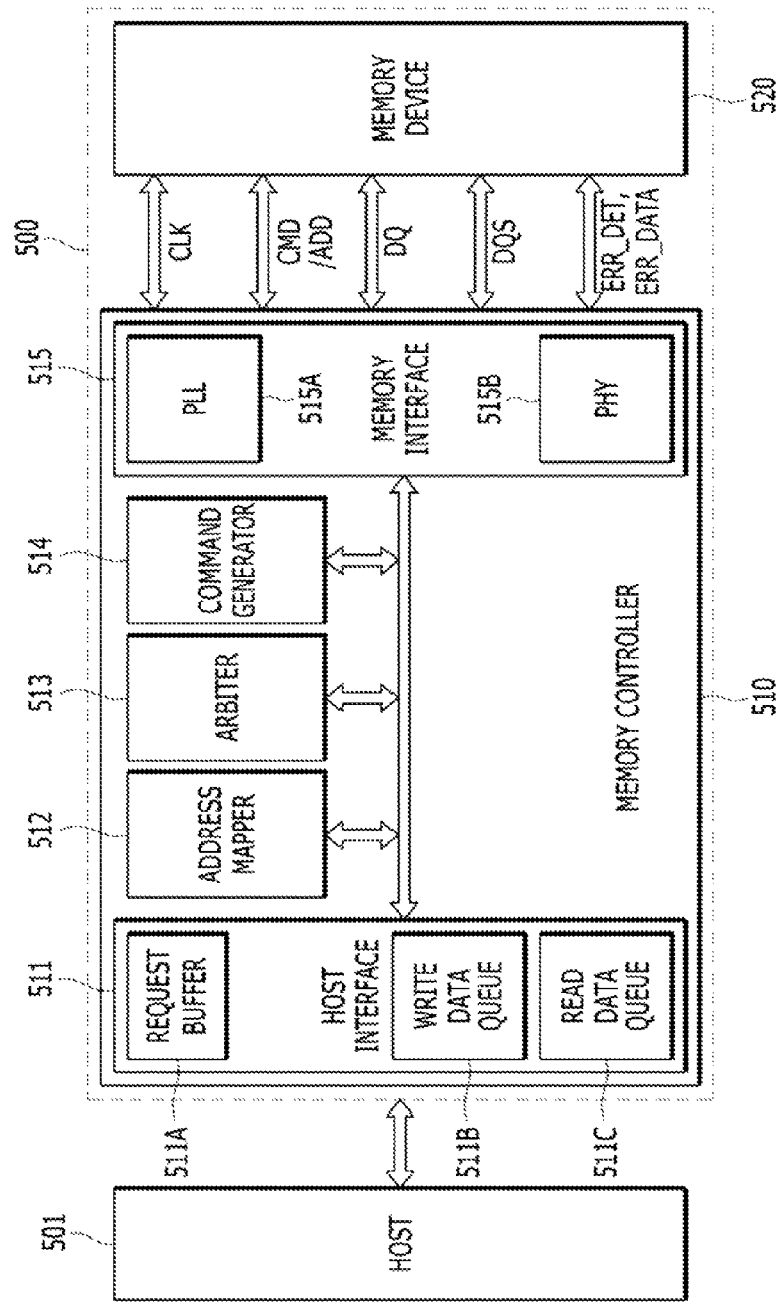
FIG. 5 illustrates a memory system in accordance with an embodiment of the present invention.

FIG. 5 is a block diagram schematically illustrating the configuration of a memory system in accordance with an embodiment of the present invention. As illustrated in FIG. 5, the semiconductor system may include a host 501 and a semiconductor apparatus 500. The semiconductor apparatus 500 may include a memory controller 510 and a memory device 520.

The host 501 may send a request (or a command signal) and data to the memory controller 510 to access the memory device 520. The host 501 may send data to the memory controller 510 to store data in the memory device 520. Furthermore, the host 501 may receive data outputted by the memory device 520 through the memory controller 510. The memory controller 510 may control the memory device 520 so that a write or read operation is performed by providing data, address information, memory setting information, a write request, or a read request, to the memory device 520 response to a request from the host 501. The memory controller 510 may relay connection between the host 501 and the memory device 520. The memory controller 510 may receive requests and data from the host 501, may generate data DQ, a data strobe signal DQS, command CMD a memory address signal ADD, and a clock signal CLK in order to control operations of the memory device 520, and may provide the data, command, and signals to the memory device 520. Furthermore, the memory controller 510 may provide the host 501 with the data DQ and the data strobe signal DQS outputted by the memory device 520.

Referring to FIG. 5, the memory controller 510 may include a host interface 511, an address mapper 512, an arbiter 513, a command generator 514, and a memory interface 515. The host interface 511 may include a request buffer 511A, a write data queue 511B, and a read data queue 511C. The memory interface 515 may be provided as an interface between the memory controller 510 and the memory device 520. The memory interface 515 may include a phase-locked loop (PLL) 515A and a physical layer (PHY) 515B. FIG. 5 illustrates the elements that form the memory controller 510, but the memory controller 510 is not limited to these elements. The memory controller 510 may further include other elements depending on a function of the memory controller 510. The request buffer 511A may receive requests from the host 501. The write data queue 511B may receive data in putted by the host 501. The read data queue 511C may receive data outputted by the memory device 520. The address mapper 512 may generate the memory address signal ADD from the physical address signal of a request received through the request buffer 511A. The arbiter 513 may provide the memory interface 515 with the memory address signal ADD and data received through the write data queue 512B and may provide the read data queue 511C with data outputted by the memory device 520. The arbiter 512 may efficiently control the write data queue 511B or the read data queue 511C based on data traffic. Furthermore the arbiter 512 may rearrange a plurality of requests received from the host 501 by taking operational efficiency of the memory device 520 into consideration. The command generator 514 may generate the command CMD based on a write request or a read request received by the request buffer 511A so that the memory device 520 performs a plurality of operations including a write, read, or refresh operation and provide the command CMD to the memory device 520. Although the host 501 and the memory controller 510 have been illustrated as being physically separated in FIG. 5, the memory controller 510 may be included (or embedded) in a processor of the host 501, such as a central processing unit (CPU), an application processor (AP), or a graphic processing unit (GPU), or may be implemented into a single chip along with the processors in the form of a system on chip (SoC).

The PHY 515B may interconnect the memory controller 510 and the memory device 520. The PLL 515A may generate a system clock signal that is used in the memory control ler 510. The memory controller 510 may send a signal for controlling an operation of the memory device 520 to the memory device 520 in synchronization with a system clock signal. The PHY 515B may convert a signal, generated by the memory controller 510, into a signal that is suitable for being used in the memory device 520 or may convert a signal, outputted by the memory device 520, into a signal that is suitable for being used in the memory controller 510 in synchronization with a system dock signal. Furthermore, the PHY 515B may generate the dock signal CLK from a system clock signal and send the clock signal CLK to the memory device 520.

The memory device 520 that has reduced errors that may occur due to asynchronous delay when a parity check operation is performed may receive memory setting information, the command CMD, the memory address signal ADD, the data DQ, the data strobe signal DQS, and the clock signal CLK from the memory controller 510 through the memory interface 515 and may perform a data reception operation based on signals. The memory device 520 may include a plurality of memory banks and store the data DQ in a specific region of a memory bank of the memory device 520 in response to the memory address signal ADD. Furthermore, the memory device 520 may perform a data transmission operation based on the command CMD, the memory address signal ADD, and the data strobe signal DQS received from the me y controller 510. The memory device 520 may send data, stored in a specific region of a memory bank, to the memory controller 510 based on the memory address signal ADD, the data DQ, and the data strobe signal DQS.

The memory device 520 may be the memory device of FIG. 4. The memory device 520 may perform a parity check operation with accurate timing, in synchronization with the clock signal CLK, by using flip-flops in each combination stage of an asynchronous delay circuit that combines the command CMD and the address ADD for the parity check operation.

The memory device 520 may perform an operation corresponding to the command CMD in response to the command CMD applied by the memory controller 510. In this case, the memory device 520 may perform a parity check operation on the command CMD and the address ADD using the method described with reference to FIG. 2 to 4. If an error is detected as a result of the parity check, the memory device 520 may stop the operation and send error information ERR_DET and ERR_DATA to the memory controller 510. The error information ERR_DET and ERR_DATA may be transmitted to the memory controller 510 through a transmission line in which the data DQ is transmitted or a separate transmission line.

The memory controller 510 may check the state of the memory device 520 based on the error information ERR_DET and ERR_DATA. If an error has occurred in the memory device 520 based on the error information ERR_DET, the memory controller 510 may no longer send the command CMD, the address ADD and the data DATA to the memory device 520 and control the memory device 520 so that it is reset.

Next, the memory controller 510 may determine what command the memory device 520 is operating in response to the error information ERR_DATA. Accordingly, the memory controller 510 may control the memory device 520 so that it performs the remaining tasks until the operation of the memory device 520 is stopped.

For example, while the memory controller 510 consecutively sends commands CMD_01-CMD_50 to the memory device 520 the memory device 520 stops operating due to an error detected in the results of a parity check when performing an operation corresponding to the command CMD_24. The memory controller 510 may determine whether the memory device 520 stops operating. The memory controller 510 may also determine if the memory device 520 stops operating while performing an operation corresponding to the command CMD_24 based on the error information ERR_DET and ERR_DATA. Accordingly, the memory controller 510 may reset the memory device 520 and send the commands CMD_24-CMD_50 to the memory device 520 again.

Figure 6:
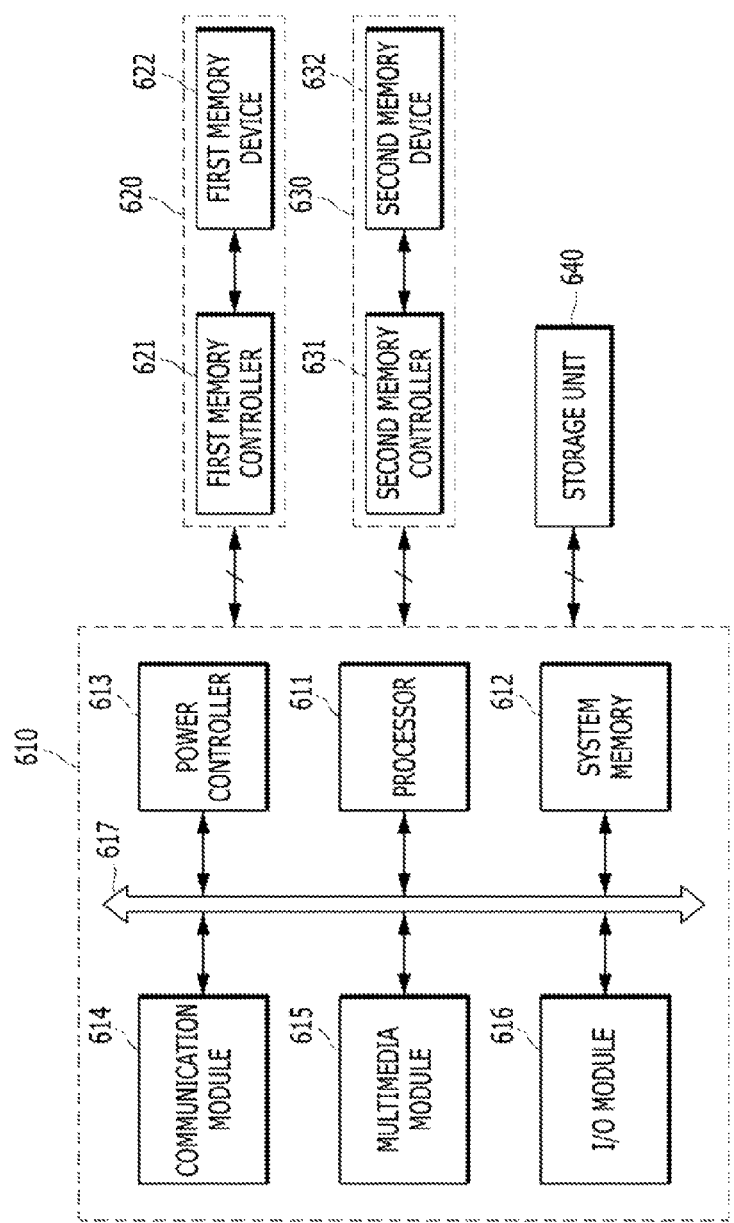
FIG. 6 is a block diagram illustrating an electronic device in accordance with an embodiment of the present invention.

FIG. 6 is a block diagram illustrating the configuration of an electronic device in accordance with an embodiment of the present invention.

The electronic device may be a computing apparatus or a system capable of executing computer-readable commands. For example, the electronic device may include workstations, laptops, client-side terminals, servers, distributed computing systems, handheld devices, and video game consoles.

As illustrated in FIG. 6, the electronic device may include a host 610, a first semiconductor apparatus 620, and a second semiconductor apparatus 630. The host 610 may include modules capable of performing various functions, such as a processor 611, a system memory 612, a power controller 613, a communication module 614, a multimedia module 615, and an I/O module 616, and may include a system bus 617 for interconnection between the modules.

The processor 611 may execute an operating system within the electronic device, may perform various operation functions, and may control the system memory 612, the power controller 613, the communication module 614, the multimedia module 615, and the I/O module 616 of the host 610, the first semiconductor apparatus 620, the second semiconductor apparatus 630, and a storage unit 640. The processor 611 may include a central processing unit (CPU), a graphic processing unit (GPU), a multimedia processor (MMP), and a digital signal processor. Furthermore, processor chips having various functions, such as application processors (APs), may be combined and implemented in the form of a system on chip.

The system memory 612 may store information about the operating system, may retain data processed by the processor 611, and may store data generated as the result of an operation performed by the processor 611.

The power controller 613 may control the amount of power supplied so that power that is suitable for the processor 611 and elements within the electronic device to operate and function. The power controller 613 may include power management IC (PMIC). The Power controller 613 may be supplied with power from outside of the electronic device or may be supplied with power from a battery (not illustrated) within the electronic device.

The communication module 614 may perform the transmission and reception of signals between the processor 611 and devices outside the electronic device based on various communication protocols. The communication module 614 may include a module capable of connecting to a wired network and a module capable of connecting to a wireless network. The wired network module may perform the transmission and reception of signals using communication methods, such as a local area network (LAN), Ethernet, and power line communication (PLC). The wireless network module may perform the transmission and reception of signals using communication methods, such as Bluetooth, radio frequency identification (RFID), long term evolution (LTE), wireless broadband Internet (WiBro) and wideband COMA (WCDMA).

The multimedia module 615 may perform the operation or input/output of multimedia data under the control of the processor 611. The multimedia module 615 may be connected to a camera device, an audio device, a 2D or 3D graphic device, a display device, and an A/V output device, and it may receive and output multimedia data from and to the devices.

The I/O module 616 may receive signals through a user interface and output, a specific signal to a user. The I/O module 611 may be connected to a keyboard, a keypad, a mouse, a stylus, a microphone, a resistive touch screen device, and a capacitive touch screen device, and it may receive signals from the devices. The I/O module 611 may output signals through a speaker, an earphone, a printer, and a display device.

The first semiconductor apparatus 620 may store data received from the host 610 or output stored data to the host 610 under the control of the processor 611 included in the host 610. The first semiconductor apparatus 620 may include at least one first memory controller 621 and at least one first memory device 622.

The first memory controller 621 may send information or signals, such as the clock CLK, the command/address CA, the data strobe signal DQS, and the data DATA, to the first memory device 622 under the control of the processor 611 included in the host 610 in order to control the data I/O operations of the first memory device 622. Such information or signals may be transmitted through the same channel or different channels.

The first memory device 622 that has reduced errors that may due to asynchronous delay when a parity check operation is performed may input and output the data DATA in response to the clock CLK, the command/address CA, and the data strobe signal DQS applied by the first memory controller 621. The first memory device 622 may be implemented using a volatile memory device, such as static RAM (SRAM), dynamic RAM (DRAM) or synchronous DRAM (SDRAM). The first semiconductor apparatus 620 may be implemented as the semiconductor apparatus described with reference to FIG. 2 to 5.

The second semiconductor apparatus 630 may operate or function as a memory system capable of rapidly recognizing a control signal received from the host 610 and starting an operation corresponding to the received control signal. The second semiconductor apparatus 630 may include at least one second memory controller 631 and at least one second memory device 632.

The second memory controller 631 may be connected to the second memory device 632 through at least one channel. The second memory controller 631 may control the read, program, and erase operations of the second memory device 632 under the control of the processor 611.

The second memory device 632 may be connected to the second memory controller 631 through a plurality of channels. The second memory device 632 may include one or more of nonvolatile memory devices, such as read only memory (ROM), programmable ROM (PROM), electrically erasable and programmable ROM (EEPROM), erasable and programmable ROM (EPROM), flash memory, phase change RAM (PRAM), magnetoresistive RAM (MRAM), resistive RAM (RRAM), and ferroelectric RAM (FRAM). A single channel may be connected to one or more nonvolatile memory devices. The nonvolatile memory devices connected to a single channel may be connected to the same control signal bus and data bus.

The electronic device may include a storage unit for storing a large amount of data or may use a storage unit external to the electronic device. The storage unit 640 may be a high-capacity information storage device for storing data and commands for various elements of the electronic device. The storage unit 640 may be implemented using a device, such as one or more hard disk drives (HDDs) or a slid-state drive (SSD) based on flash memory.

The elements illustrated in FIG. 6 have been functionally sorted, but are not necessarily configured as physical elements. For example, two or more of the elements illustrated in FIG. 6 may be formed in a single physical semiconductor chip or may be included in a single package.

In accordance with this technology, glitches attributable to asynchronous delay may be removed and parity operation timing may be accurately set through XOR combinations for bits of data to be checked in synchronization with a clock.

Furthermore in accordance with this technology, if an error has occurred in data to be checked, reconstructed data is used. Accordingly, an increase in the number of circuits for a parity check circuit may be prevented.

Although various embodiments have been described for illustrative purposes, it will be apparent to those skilled in the art that various changes and modifications may be made without departing from the spirit and scope of the invention as defined in the following claims.

What is claimed is:

1. A parity check circuit, comprising:
a plurality of first flip-flops storing and outputting corresponding signals of first to Nth (N is a natural number) signals in response to a clock;
a first combination circuit performing XOR combinations on two or more of output signals of the first flip-flops;
a second combination circuit generating first to Nth combination signals by performing XOR combinations on two or more of the output signals of the first flip-flops and an output signal of the first combination circuit in response to the clock, wherein the first combination signal is the first signal and a Kth (K is a natural number of 2≤K≤N) combination signal of the first to Nth combination signals is obtained by combining the first to Kth signals of the first to Nth signals;

a parity checker detecting whether an error is present in the first to Nth signals in response to the Nth combination signal;

a third combination circuit generating first to Nth reconstruction signals by combining one or more of the first to Nth combination signals, wherein the first reconstruction signal is the first combination signal and a Kth reconstruction signal of the first to Nth reconstruction signals is obtained by combining a (K−1)th combination signal and the Kth combination signal of the first to Nth combination signals; and a signal storage circuit storing the first to Nth reconstruction signals based on a detection result of the parity checker.

2. The parity check circuit of claim 1, further comprising:
a plurality of third flip-flops storing and outputting the first to Nth reconstruction signals in response to the clock.

3. The parity check circuit of claim 2, wherein the parity checker activates a latch enable signal when the error is present in the first to Nth signals and deactivates the latch enable signal when the error is not present in the first to Nth signals.

4. The parity check circuit of claim 3, wherein the signal storage circuit comprises:
a plurality of fourth flip-flops storing output signals of the third flip-flops in response to the clock when the latch enable signal is activated.

5. The parity check circuit of claim 1, wherein the first combination circuit comprises:
a plurality of first gates performing XOR combinations on two or more of the output signals of the first flip-flops; and
a plurality of second gates performing XOR combinations on two or more of the output signals of the first flip-flops and output signals of the first gates.

6. The parity check circuit of claim 5, wherein the second combination circuit comprises:
one or more combination stages comprising two or more third gates for performing XOR combinations on two or more received signals and outputting combined results; and
one or more flip-flop stages comprising two or more second flip-flops for storing and outputting a received signal in response to the clock,
wherein the combination stages and the flip-flop stages are alternately disposed.

7. The parity check circuit of claim 1, wherein:
the first to Nth reconstruction signals correspond to the respective first to Nth signals; and
the first to Nth reconstruction signals have logic values identical with respective logic values of the first to Nth signals.

* * * * *